US009175830B2

(12) United States Patent
Yang et al.

(10) Patent No.: US 9,175,830 B2
(45) Date of Patent: Nov. 3, 2015

(54) METHOD FOR PRODUCING HIGH-LUMINANCE MONOCHROMATIC LIGHT BASED ON OPTICAL WAVELENGTH CONVERSION AND LIGHT SOURCE

(75) Inventors: Yi Yang, Shenzhen (CN); Yi Li, Pleasanton, CA (US)

(73) Assignee: APPTRONICS (CHINA) CORPORATION, Shenzhen (CN)

( * ) Notice: Subject to any disclaimer, the term of this patent is extended or adjusted under 35 U.S.C. 154(b) by 161 days.

(21) Appl. No.: 14/116,669

(22) PCT Filed: Feb. 29, 2012

(86) PCT No.: PCT/CN2012/071799
§ 371 (c)(1),
(2), (4) Date: Mar. 25, 2014

(87) PCT Pub. No.: WO2012/152107
PCT Pub. Date: Nov. 15, 2012

(65) Prior Publication Data
US 2014/0347860 A1    Nov. 27, 2014

(30) Foreign Application Priority Data
May 9, 2011    (CN) .......................... 2011 1 0120169

(51) Int. Cl.
*H01J 1/62*    (2006.01)
*H01L 33/00*    (2010.01)
(Continued)

(52) U.S. Cl.
CPC ... *F21V 9/08* (2013.01); *F21K 9/56* (2013.01); *F21V 9/16* (2013.01); *F21V 13/08* (2013.01); *H01L 33/504* (2013.01)

(58) Field of Classification Search
None
See application file for complete search history.

(56) References Cited

U.S. PATENT DOCUMENTS 3,999,062 A    12/1976    Demsky et al.
5,998,925 A    12/1999    Shimizu et al.
(Continued)

FOREIGN PATENT DOCUMENTS

CN    1547266    11/2004
CN    1929155    3/2007
(Continued)

OTHER PUBLICATIONS

International Search Report in the parent PCT application No. PCT/CN2012/071799, dated May 24, 2012.
(Continued)

*Primary Examiner* — Hemang Sanghavi
(74) *Attorney, Agent, or Firm* — Chen Yoshimura LLP (57) ABSTRACT

Disclosed is a method for producing a high-luminance monochromatic light based on optical wavelength conversion, which is used in a light source comprising an excitation light source, and comprises the steps of: setting a first wavelength conversion material and a second wavelength conversion material; using an excitation beam to excite the first wavelength conversion material and the second wavelength conversion material, wherein the first wavelength conversion material absorbs the excitation light to produce a first excited light; the second wavelength conversion material absorbs a first waveband portion of the first excited light to produce a second excited light, where the energy of the absorbed first waveband portion is more than 50% of the total energy of the first excited light; mixing the second excited light and the unabsorbed portion of the first excited light together to form the high-luminance monochromatic light.

20 Claims, 4 Drawing Sheets (51) Int. Cl.
*F21V 9/08* (2006.01)
*F21V 9/16* (2006.01)
*F21V 13/08* (2006.01)
*F21K 99/00* (2010.01)
*H01L 33/50* (2010.01)

(56) References Cited

U.S. PATENT DOCUMENTS

| | | | |
|---|---|---|---|
| 6,294,800 | B1 | 9/2001 | Duggal et al. |
| 6,685,852 | B2 | 2/2004 | Setlur et al. |
| 6,884,671 | B2 | 4/2005 | Jenq |
| 7,737,621 | B2 | 6/2010 | Masuda et al. |
| 7,863,635 | B2 | 1/2011 | Andrews et al. |
| 7,906,892 | B2 | 3/2011 | Choi et al. |
| 2005/0206301 | A1* | 9/2005 | Ng .................. 313/501 |
| 2006/0226759 | A1 | 10/2006 | Masuda et al. |
| 2008/0211386 | A1 | 9/2008 | Choi et al. |
| 2009/0039375 | A1 | 2/2009 | LeToquin et al. |
| 2010/0213821 | A1 | 8/2010 | Masuda et al. |
| 2010/0264448 | A1 | 10/2010 | Choi et al. |
| 2011/0018026 | A1* | 1/2011 | Konno et al. ............ 257/100 |
| 2011/0057118 | A1 | 3/2011 | Zheng et al. |
| 2011/0089456 | A1 | 4/2011 | Andrews et al. |
| 2011/0228514 | A1* | 9/2011 | Tong et al. .............. 362/84 |
| 2011/0248296 | A1 | 10/2011 | Choi et al. |
| 2013/0228812 | A1* | 9/2013 | Annen et al. ............ 257/98 |

FOREIGN PATENT DOCUMENTS

| | | |
|---|---|---|
| CN | 101212015 | 7/2008 |
| CN | 101562227 | 10/2009 |
| CN | 101650311 | 2/2010 |
| CN | 201717287 | 1/2011 |
| JP | 2011-71404 | 4/2011 |

OTHER PUBLICATIONS

IPRP in the parent PCT application No. PCT/CN2012/071799, dated Nov. 12, 2013.

Chinese Office Action, dated Jun. 5, 2013, in a counterpart Chinese patent application, No. CN 201110120169.7.

* cited by examiner

METHOD FOR PRODUCING HIGH-LUMINANCE MONOCHROMATIC LIGHT BASED ON OPTICAL WAVELENGTH CONVERSION AND LIGHT SOURCE

FIELD OF THE INVENTION

This invention relates to lighting device with wavelength conversion material, and in particular, it relates to light excitation method and the structure of the lighting device.

DESCRIPTION OF THE RELATED ART

The wavelength conversion based method for generating white light has recently become the mainstream technology to generate white light or monochromatic light because its advantages of high efficiency and low cost.

Present wavelength conversion material includes phosphor powders, light emitting dye and nano-structured lighting material. Taking phosphor for example, the U.S. Pat. No. 5,998,925 disclosed a method using YAG phosphor and blue light source to generate white light, wherein the blue light source is used as excitation light source. By absorbing a part of the blue light emitted from the blue light source, YAG phosphor is excited to generate yellow light, which is mixed with remaining blue light to form a white light. This method for generating white light is very efficient.

US patents or applications U.S. Pat. No. 6,685,852B1, U.S. Pat. No. 6,294,800B1 and U.S. Pat. No. 6,844,671 disclosed respectively a method of generating white light using UV LED (ultraviolet LED) as excitation light source. Because ultraviolet light is invisible light, so a phosphor mixture mixed by multiple phosphors which can be excited by ultraviolet light to generate different converted lights can emits white light which is formed by mixing the different converted lights.

The prior arts are all based on light mixing technology to generate white light. To generate monochromatic light, special monochromatic phosphors are generally used in the arts to be directly excited to generate converted light, which is then filtered by a light filtering element to remove excitation light which is not absorbed by the phosphor. For example, yellow light can be generated by mixing red light and green light, but instead of the mixture of red phosphor and green light, yellow phosphor is generally used in the arts to get yellow light. That is because red phosphor can absorb a part of the converted green light emitted by the green phosphor and results in reduced efficiency of the phosphor mixture. As another example, to generate red light, red phosphor is commonly used to be excited by blue light, other phosphors with different colors will not be mixed with the red phosphor in order to obtain red color purity.

The disadvantage of the prior arts is, the brightness of the monochromatic light generated by exciting monochromatic phosphor is not enough. Although recently it has been studied to get high brightness white light by phosphor mixture, but this technology is not used in the field of high brightness monochromatic light generation due to some technical limitations.

SUMMARY OF THE INVENTION

To overcome the disadvantages of the prior arts, the present invention discloses a new method to generate high brightness monochromatic light by light mixing approach while the color purity of the monochromatic light is not changed.

To solve this technical problem, the basic idea of the present invention is: based on wavelength conversion technology and the color light mixing principle, by mixing two wavelength conversion materials, trying different mixing parameters and then analyzing the results, the inventors discovered that when the absorption spectrum and the emission spectrum of the two phosphors in the mixture meet some certain conditions, the brightness of monochromatic light emitted by the phosphor mixture can be increased while the color purity is as good as that achieved by the conventional art. The detailed analysis is: the first converted light emitted by the first wavelength conversion material can be divided into two parts in the wavelength domain, i.e., an effective region and a non-effective region. If the light power of the non-effective region is absorbed by the second wavelength conversion material which is excited to emit the second converted light in the effective region, then the emitted light is generated as a mixture of the effective region of the first converted light and the second converted light after filtering by a light filtering element. If only the second wavelength conversion material is used to be directly excited to generate the second converted light, the color purity and saturation of the second converted light is a bit better than that of the mixed light, but the total flux is much smaller. The color purity and saturation of a monochromatic light can be improved by using color modification filter, so if the light flux loss caused by the color modification filter is not significant, the method of generating monochromatic light by mixing two wavelength conversion materials should be the best choice.

To achieve these basic ideas and goals, the present invention provides a method for generating a high brightness monochromatic light based on wavelength conversion, and in particular comprising the following steps:

A. providing the first wavelength conversion material and the second wavelength conversion material;

B. using an excitation light to excite the first wavelength conversion material and the second wavelength conversion material, wherein the first wavelength conversion material absorbs the exciting light and emits the first converted light, the second wavelength conversion material absorbs a first spectral part of the first converted light and emits the second converted light, the light power of the first spectral part absorbed by the second wavelength conversion material is equal to or greater than 50% of the total light power of the first converted light;

C. mixing the second converted light and the remained part of the first converted light which is not absorbed by the second wavelength conversion material to form the high brightness monochromatic light.

Further more, in above method, the second wavelength conversion material also absorbs the excitation light to emit the second converted light. The first wavelength conversion material and the second wavelength conversion material are spatially separated apart, or form respective layers that are stacked together, or are mixed to form a single mixed layer.

In detail, when the first wavelength conversion material and second wavelength conversion material are spatially apart, a fourth dichroic element is located between the first wavelength conversion material and the second wavelength conversion material which transmits the first converted light and reflects or partially reflects the second converted light.

Or, in the step A the first wavelength conversion material and the second wavelength conversion material are disposed onto a reflecting plate, and a third dichroic element is set at an angle on the other side of the first wavelength conversion material and the second wavelength conversion material. The third dichroic element transmits the excitation light and reflects the converted lights or the third dichroic reflects the excitation light and transmits the converted lights, so that the third dichroic element is used in the step B to guide the excitation light to the first wavelength conversion material and the second wavelength conversion material, and used in the step C to provide the high brightness monochromatic light by transmission or reflection.

In above methods, the step A may also includes a step of setting a dichroic element into the output light path of the high brightness monochromatic light. The dichroic element has the dichroic characteristics which can filter the excitation light which is not absorbed by the first wavelength conversion material and the second wavelength conversion material from the high brightness monochromatic light, so it can be used in step C to selectively output the high brightness monochromatic light. Further more, the dichroic element also has the dichroic characteristics which can separate the first spectral part and the second spectral part of the first converted light, so it can be used in step B to reflect the light in the first spectral part back to the second wavelength conversion material and transmit the light in the second wavelength region and the second converted light, so the high brightness monochromatic light which consists of the second converted light and the second spectral part of the first converted light can be selectively emitted in step C.

The above methods also comprises step D, in which a color modification filter is used to modify the spectrum of the high brightness monochromatic light in order that the color coordinates of the output light can achieve predetermined values.

In above methods, the light power of the second converted light is greater than 40% and less than 80% of the high brightness monochromatic light.

In above methods, the step A also includes a step of providing a second dichroic element on one side of the first wavelength conversion material and the second wavelength conversion material facing the input excitation light. The second dichroic element has the dichroic characteristics that can transmit the excitation light and reflect the first converted light.

In above methods, there are air gaps between the first wavelength conversion material or the second wavelength conversion material and the dichroic elements near the first wavelength conversion material or the second wavelength conversion material.

To achieve the based ideas and goals, the present invention also provides a light source device which includes an excitation source, and a first wavelength conversion material and a second wavelength conversion material that can be excited by the excitation light emitted from the excitation source. In particular, the light source device provides high brightness monochromatic light by anyone of the above methods.

The above methods are easy to be realized and cost efficient due to its low cost.

DETAILED DESCRIPTION OF THE PREFERRED EMBODIMENTS

Preferred embodiments of the present invention are described with reference to the Figures.

Figure 1:
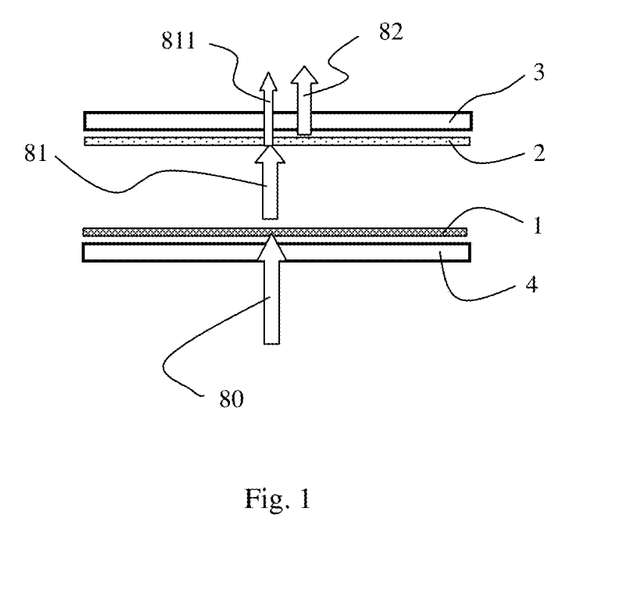
FIG. 1 illustrates the light source structure and its wavelength conversion process according to an embodiment of the present invention.

As shown in FIG. 1, the light source device of the present invention includes excitation source which provides excitation light 80, and a first wavelength conversion material 1 and a second wavelength conversion material 2 that can be excited by the excitation light 80. The light source device provides high brightness monochromatic light as its output light by the following method and steps:

A. providing the first wavelength conversion material 1 and the second wavelength conversion material 2;

B. using the excitation light 80 to excite the first wavelength conversion material 1 and the second wavelength conversion material 2, wherein the first wavelength conversion material 1 absorbs the excitation light 80 and emits the first converted light 81, and the second wavelength conversion material 2 absorbs a first spectral part of the first converted light 81 and emits a second converted light 82, wherein the light power of the first spectral part absorbed by the second wavelength conversion material is equal to or greater than 50% of the total light power of the first converted light;

C. the second converted light 82 and the remaining part of the first converted light 811 which is not absorbed by the second wavelength conversion material are mixed to form the high brightness monochromatic light.

The wavelength conversion materials 1 and 2 can be phosphor powders, nano-structured lighting materials or light emitting dye, which can be mixed with one or more transparent material to improve the stability of the output of the light source device. Taking phosphor powder for example (but not limited to phosphor powder), the transparent material can be transparent gel or transparent glass material, which can be molded or mixed with the phosphor powder. Or the transparent material also can be transparent plastic film material on which the phosphor powder can be hot pressed. For phosphor powder which requires moisture proofing, any transparent material mentioned above can be used to carry the phosphor powder, and then the transparent material and the phosphor powder can be sealed to prevent moisture. To facilitate heat dissipation of the wavelength conversion material, a layered shape of the wavelength conversion material is preferred. Further more, scattering particles such as (but not limited to) titanium oxide particles or alumina particles can be mixed with wavelength conversion material to improve the light absorption capacity of the wavelength conversion material. In the embodiment shown in FIG. 1, to illustrate the wavelength conversion process clearly the first wavelength conversion material 1 and the wavelength conversion material 2 are shown as spatially separated apart, but in fact it is more desired to mix the first wavelength conversion material and the second wavelength conversion material to be a single mixed layer or to form the first wavelength conversion material layer and the second wavelength conversion material as respective layers in a stack.

In the above method, the step A may also include a step of providing a second dichroic element 4 on one side of the first wavelength conversion material and the second wavelength conversion material facing the input excitation light 80, where the second dichroic element 4 has the light separation property of transmitting the excitation light and reflecting the first converted light. In the structure shown in FIG. 1, the layer including the first wavelength conversion material can sufficiently reflect the second converted light. When the structure of the first wavelength conversion material and the second wavelength conversion material is different from that shown in FIG. 1, for example when the two wavelength conversion materials are mixed in a single layer, it is preferred that the second dichroic element 4 has the dichroic characteristics that it reflects the second converted light. This way, the first or second converted light can be emitted out from a single side of wavelength conversion layer to increase the light extraction efficiency of the light source device.

Furthermore, the step A also includes a step of providing a dichroic element 3 in the output light path of the high brightness monochromatic light. The dichroic element 3 has the dichroic characteristics which can filter the excitation light which is not absorbed by the first wavelength conversion material and the second wavelength conversion material from the high brightness monochromatic light, so it can be used in step C to selectively output the high brightness monochromatic light. The color purity of the output light can be improved.

Figure 3:
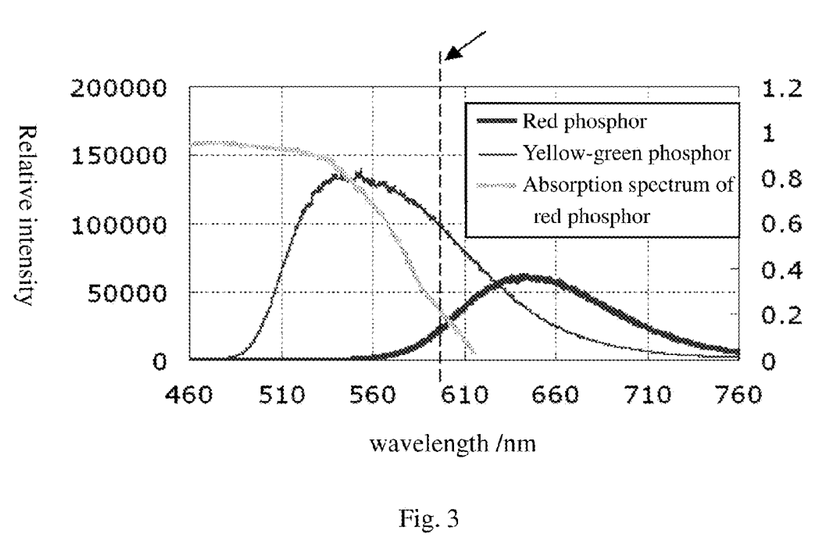
FIG. 3 illustrates various spectral curves to show the method of obtaining monochromatic light in the present invention.

Take high brightness red light for example. The wavelength conversion material 1 is yellow phosphor, green phosphor or orange phosphor (but not limited to these phosphors), the wavelength conversion material 2 is red phosphor, the excitation light 80 is blue light, violet light or UV light. The second dichroic element 4 can be a dichroic filter that transmits excitation light 80 and reflects the first converted light 81, or furthermore also reflects the second converted light 82. As shown in FIG. 3, the first wavelength conversion material 1 is yellow-green phosphor for example, whose emission spectrum is shown as the thin solid line in FIG. 3, the second wavelength conversion material 2 is red phosphor for example, whose emission spectrum is shown as the thick solid line. The absorption spectrum of the red phosphor is also shown in FIG. 3 as the thick filled line, and the dashed line marked by the arrow illustrates the different spectral parts being effective or non-effective to the red output light (wavelength region of greater than 600 nm) of the light source device. It can be seen that the yellow-green light (the first converted light 81, with total light power of L) is divided by the dashed line into two parts, one part is called the first spectral part which is non-effective or almost non-effective to the red output light, another part is called the second spectral part which is effective to the red output light. The first spectral part is mostly inside of the absorption spectrum range of the red phosphor so that most of the first spectral part will be absorbed by the red phosphor, while little of the second part is absorbed. Define the light powers of the first spectral part and the second spectral part as E and F respectively, then L=E+F. And define the red light power emitted by the red phosphor as P, so the total light power emitted from a side of the red phosphor layer is F+P. There is an overlap between the normalized spectra of the first converted light and the second converted light. The presently available red phosphor has relatively poor thermal stability, so the wavelength conversion efficiency tends to decrease significantly when the emission light power increases. So the red light obtained by the method of the present embodiment has more brightness than that emitted by the directly excited red phosphor. And if only the yellow-green phosphor with high efficiency and good thermal stability is used to generate red light (the second spectral part) with wavelength greater than 600 nm by color filtering, the light power loss is significant, so the light efficiency of the light source device is remarkably low compared with the method of the present embodiment. In the method of the present embodiment, the red phosphor is used to absorb the first spectral part of the yellow-green light and convert it to light of the second spectral part, so the color purity and brightness of the output light are effectively achieved at the same time. This is the key point of the present invention. After a series of experiments it is found that when the light power of the first spectral part that is absorbed is equal to or greater than 50% of the total light power of the first converted light, the best lighting efficiency and color purity of the light source device are achieved. In addition, the second wavelength conversion material absorbs the excitation light and emits the second converted light, which is very helpful to increasing the ratio of the second converted light in the output light.

From the above analysis it can be known that, for further improving the color purity of the output light, it is preferred that the dichroic element 3 shown in FIG. 1 further has dichroic characteristics which separate the first spectral part and the second spectral part of the first converted light, so that in step B the dichroic element reflects the light of the first spectral part back to the second wavelength conversion material and transmits the light of the second spectral part and the second converted light, and in step C the high brightness monochromatic light which consists of the second converted light and the second spectral part of the first converted light is selectively output.

Or, if the excitation light is mostly absorbed, in step A of the present embodiment a dichroic element which has dichroic characteristics which separate the first spectral part and the second spectral part of the first converted light is provided in the output light path of the high brightness monochromatic light. The dichroic element can be used to replace the dichroic element 3 shown in FIG. 1.

Figure 2:
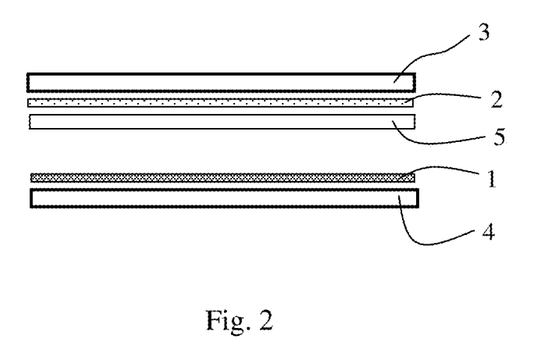
FIG. 2 is an improved structure of FIG. 1.

For improving the extraction efficiency of the second converted light, as shown in FIG. 2, when the first wavelength conversion material and second wavelength conversion material are spatially separated apart, in the method of the present embodiment a fourth dichroic element 5 is provided between the first wavelength conversion material 1 and the second wavelength material 2 to transmit the first converted light and reflect the second converted light. There is an overlap between the normalized spectra of the first converted light and the second converted light, so these two converted lights cannot be separated completely in wavelength domain. In this case the fourth dichroic element has dichroic characteristics that transmit the first converted light and partially reflect the second converted light.

Figure 4:
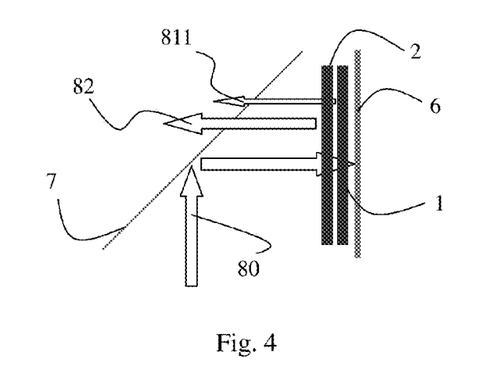
FIG. 4 is a schematic view of an alternative embodiment of the present invention.

FIG. 4 is a schematic view of an alternative embodiment of the present invention. In this embodiment, the first wavelength conversion material 1 and the second wavelength conversion material 2 are disposed onto a reflecting plate 6, and a third dichroic element 7 is provided at an angle on the other side of the first and second wavelength conversion materials to reflect excitation light 80 and transmit converted light 811 and 82. So the third dichroic element 7 is used in step B to guide the excitation light to the first wavelength conversion material 1 and the second wavelength conversion material 2, and used in step C to provide the high brightness monochromatic light by transmitting the mixture of the second converted light 82 and the unabsorbed part 811 of the first converted light. In this embodiment, when the first wavelength conversion layer and second wavelength conversion layer are formed as respective layers in a stack, the first wavelength conversion material 1 is located closer to the reflecting plate 6 than the second wavelength conversion material 2 in order that the second wavelength conversion material 2 can fully absorb the first spectral part of the first converted light. And when the two wavelength conversion materials are mixed to form a single layer, the first wavelength conversion material 1 and the second wavelength conversion material 2 can be both located close to the reflecting plate 6. As an equivalent method, the third dichroic element in this embodiment also can be chose to have the dichroic characteristics that transmits the excitation light and reflects both the second converted light and the second spectral part of the first converted light, so the third dichroic element can be used in step B to guide the excitation light to the first wavelength conversion material and the second wavelength conversion material, and used in step C to provide the high brightness monochromatic light by reflection.

Figure 5:
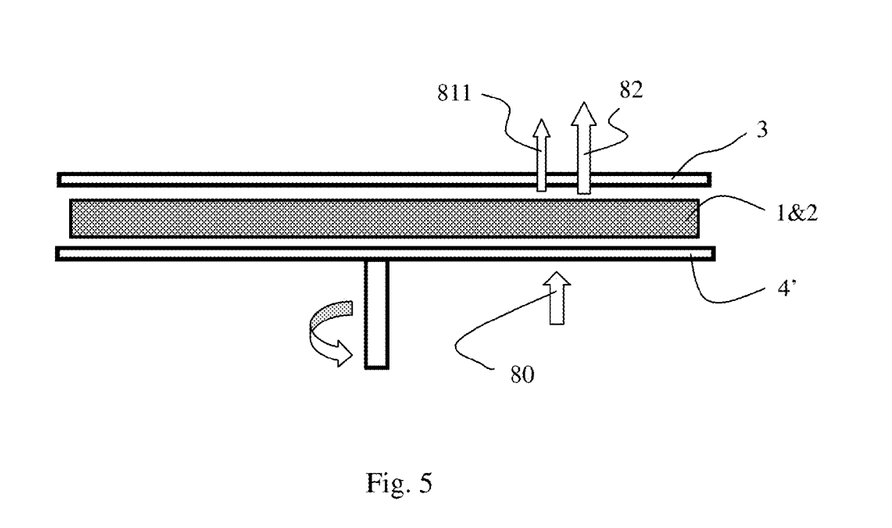
FIG. 5 is an alternative improved structure of FIG. 1.

For light source device with high power output, in the method of the present embodiment, to prolong the useful life time of the wavelength conversion materials, the first wavelength conversion material and the second wavelength conversion material are disposed onto a moving device to move relative to the excitation light, so that the wavelength conversion materials are excited in turn to prevent a decrease in lighting efficiency caused by heat concentration. The moving device includes rotating disc or wheel with wavelength conversion materials, which can be used to replace or carry the second dichroic element 4 in the embodiment of FIG. 1 or reflecting plate 6 in the embodiment of FIG. 4. As shown in FIG. 5, the transparent disc 4' used to replace the second dichroic element 4 should have the same dichroic characteristics of the dichroic element 4. This transparent disc 4', driven by the rotating shaft, carries the first wavelength conversion material 1, the second wavelength conversion material 2 and the first dichroic element to rotate.

In the above embodiments, there are air gaps between the first wavelength conversion material 1 or the second wavelength conversion material 2 and the elements which are close to them such as the second dichroic element 4, dichroic element 3 or reflecting plate 6. The air gaps can improve the lighting efficiency and brightness because the second dichroic element 4, dichroic element 3 or reflecting plate 6 can reflect light rays with large incident angle by total internal reflection.

Figure 6:
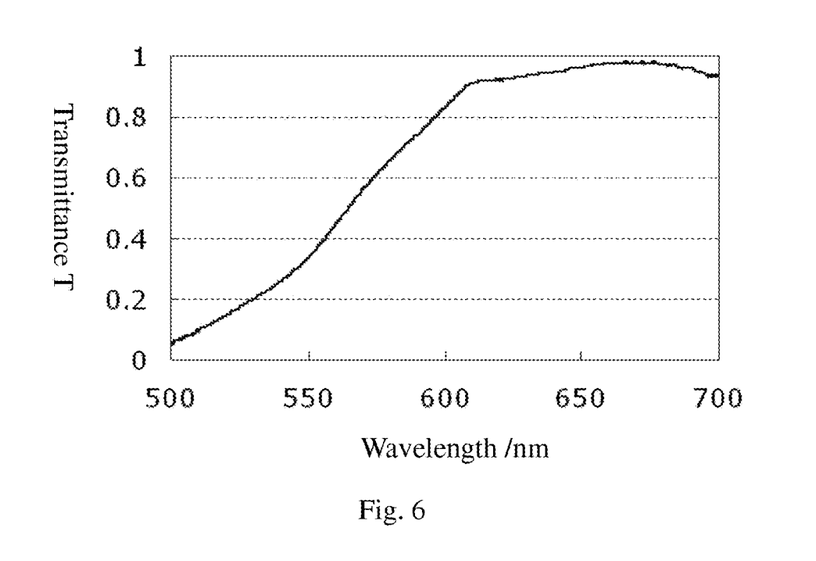
FIG. 6 illustrates the transmission characteristics of a conventional dichroic element.
Figure 7:
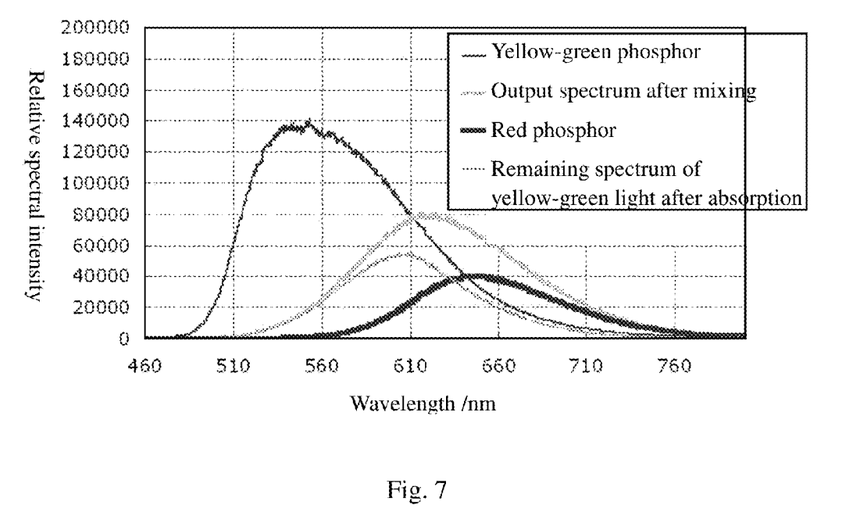
FIG. 7 is the output light spectra of the present invention using the dichroic element shown in FIG. 6.

Considering the light incident angle, the dichroic characteristics of the dichroic element 3 in the embodiments of FIG. 1 or FIG. 5 may be less than ideal. A typical transmission curve of this dichroic element is shown in FIG. 6. For the red light with wavelength larger than 610 nanometer its transmittance is almost 1, for the yellow-green light with wavelength smaller than 530 nanometer its transmittance is below 20%, and for the light with wavelength between 530 nanometer and 610 nanometer the transmittance increases when the wavelength increases. Meanwhile from FIG. 3, it can be seen that the red phosphor cannot fully absorb the yellow-green light of the first spectral part (to the left of the dashed line), so with the presence of the dichroic element 3 shown in FIG. 6, the output light of the light source device will be as shown in FIG. 7: the thick solid line illustrates the emission spectrum of the red phosphor, the thin solid line illustrates the emission spectrum of the yellow-green phosphor, the thin filled line illustrates the remaining spectrum of the converted light of the yellow-green phosphor after absorption by the red phosphor, and the thick filled line illustrates the output spectrum after the dichroic element 3. The corresponding test data of FIG. 7 shows that 67% of the yellow-green converted light is absorbed, the remaining yellow-green light is mixed with the red converted light to form the output light, wherein the red converted light account for 45%. It can be seen that the color purity of this red output light is slightly poorer than the red light provided directly by a red phosphor.

Figure 8:
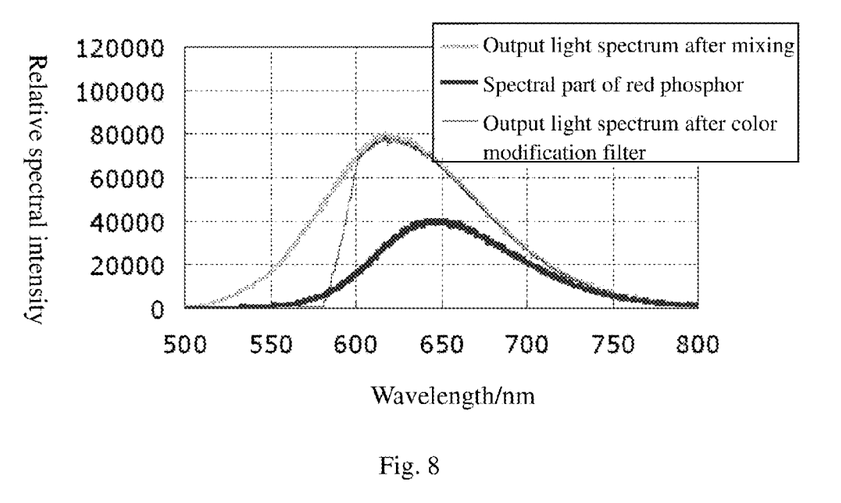
FIG. 8 is the output light spectra of the present invention after using a color modification filter based on the spectra shown in FIG. 7.

So the method of the present embodiment also comprises step D, in which a color modification filter is used to modify the spectrum of the high brightness monochromatic light in order that the color coordinates of the output light can achieve predetermined values. Available color modification filters have good filtering characteristics. As shown in FIG. 8, the thick filled line illustrates the spectrum of the mixed light, which is filtered by the color modification filter to form the output light shown as the thin solid line. The test data shows that the red converted light accounts for 57% of the final output light. Although the brightness decreases, both the color purity and color saturation are improved and the flux of the output light in this embodiment increases by 49.6% compared with that of traditional method which excites the red phosphor directly. In the method of the present embodiment, the light power of the second converted light is controlled to be greater than 40% and less than 80% in the high brightness monochromatic output light by changing the ratio of the two wavelength conversion materials.

The color modification filter can filter the input light by absorption, or by selectively transmitting the needed spectral power and reflecting unneeded spectral power.

The above embodiments can be improved, for example, by omitting the dichroic element 3 to save cost when the color modification filter is used. In addition, the above embodiments are not limited to generating a certain monochromatic light. According to different requirement of the monochromatic output light, different wavelength conversion material groups can be chosen to obtain other monochromatic light such as green light. Any embodiment following the principle of the present invention is within the scope of this invention, and any light source device which contains an excitation source and provides high brightness monochromatic output light by the methods of the present embodiments is also within the scope of this invention.

What is claimed is:

1. A method for generating a high brightness monochromatic light based on wavelength conversion, comprising:
    A. providing a first wavelength conversion material and a second wavelength conversion material;
    B. using an excitation light to excite the first wavelength conversion material and the second wavelength conversion material, wherein the first wavelength conversion material absorbs the exciting light and emits a first converted light, the second wavelength conversion material absorbs a first spectral part of the first converted light and emits a second converted light, wherein a light power of the first spectral part absorbed by the second wavelength conversion material is equal to or greater than 50% of a total light power of the first converted light;
    C. mixing the second converted light and a remaining part of the first converted light which is not absorbed by the second wavelength conversion material to form the high brightness monochromatic light.

2. The method of claim 1, wherein the second wavelength conversion material further absorbs the excitation light to emits the second converted light.

3. The method of claim 1, wherein the step A further includes a step of providing a dichroic element in an output light path of the high brightness monochromatic light, wherein the dichroic element has dichroic characteristics which separate the high brightness monochromatic light from the excitation light which is not absorbed by the first wavelength conversion material and the second wavelength conversion material, wherein in step C the high brightness monochromatic light is selectively output.

4. The method of claim 3, wherein the dichroic element further has dichroic characteristics which separate the first spectral part and the second spectral part of the first converted light, wherein in step B the dichroic element reflects the light of the first spectral part back to the second wavelength conversion material and transmits the light of the second spectral part and the second converted light, and wherein in step C the high brightness monochromatic light which consists of the second converted light and the second spectral part of the first converted light is selectively output.

5. The method of claim 1, wherein step A further includes a step of providing a dichroic element in an output light path of the high brightness monochromatic light, wherein the dichroic element has dichroic characteristics which separate the first spectral part and the second spectral part of the first converted light, wherein in step B the dichroic element reflects the light of the first spectral part back to the second wavelength conversion material and transmits the light of the second spectral part and the second converted light.

6. The method of claim 1, further comprising:
   D. using a color modification filter to modify a spectrum of the high brightness monochromatic light so that color coordinates of the high brightness monochromatic light achieve predetermined values.

7. The method of claim 1, wherein a light power of the second converted light is greater than 40% and less than 80% of a light power of the high brightness monochromatic light.

8. The method of claim 1, wherein the first wavelength conversion material and the second wavelength conversion material are spatially separated apart, or the first wavelength conversion material and the second wavelength conversion material form respective layers arranged in a stack, or the first wavelength conversion material and the second wavelength conversion material are mixed to form a single layer.

9. The method of claim 8, wherein when the first wavelength conversion material and second wavelength conversion material are spatially separated apart, a fourth dichroic element is provided between the first wavelength conversion material and the second wavelength material, wherein the fourth dichroic element transmits the first converted light and reflects or partially reflects the second converted light.

10. The method of claim 1, wherein in step A the first wavelength conversion material and the second wavelength conversion material are disposed onto a reflective plate, and a third dichroic element is provided at an angle on another side of the first wavelength conversion material and the second wavelength conversion material;
   wherein the third dichroic element has dichroic characteristics that reflect the excitation light and transmit the second converted light and the second spectral part of the first converted light, wherein in step B the third dichroic element guides the excitation light to the first wavelength conversion material and the second wavelength conversion material, and wherein in step C the third dichroic element provides the high brightness monochromatic light by transmission;
   or, the third dichroic element has dichroic characteristics that transmit the excitation light and reflect the second converted light and the second spectral part of the first converted light, wherein in step B the third dichroic element guides the excitation light to the first wavelength conversion material and the second wavelength conversion material, and wherein in step C the third dichroic element provides the high brightness monochromatic light by reflection.

11. The method of claim 10, wherein when the first wavelength conversion material and the second wavelength conversion material form respective layers arranged in a stack on the reflective plate, the first wavelength conversion material layer is located closer to the reflective plate than the second wavelength conversion material layer.

12. The method of claim 1, wherein the first wavelength conversion material and the second wavelength conversion material are disposed on a moving device and driven to move relative to the excitation light.

13. The method of claim 12, wherein the moving device includes a rotating disc or wheel.

14. The method of claim 1, wherein step A further includes a step of providing a second dichroic element on one side of the first wavelength conversion material and the second wavelength conversion material facing the excitation light, wherein the second dichroic element has dichroic characteristics that transmit the excitation light and reflect the first converted light.

15. The method of claim 14, further comprising providing an air gap between the first wavelength conversion material or the second wavelength conversion material and the second dichroic element.

16. The method of claim 3, further comprising providing an air gap between the first wavelength conversion material or the second wavelength conversion material and the dichroic element.

17. A light source device, comprising an excitation light source, and a first wavelength conversion material and a second wavelength conversion material that are excited by an excitation light emitted from the excitation light source, wherein the light source devices generates a high brightness monochromatic light using the method of claim 1.

18. The method of claim 3, wherein step A further includes a step of providing a second dichroic element on one side of the first wavelength conversion material and the second wavelength conversion material facing the excitation light, wherein the second dichroic element has dichroic characteristics that transmit the excitation light and reflect the first converted light.

19. The method of claim 5, wherein step A further includes a step of providing a second dichroic element on one side of the first wavelength conversion material and the second wavelength conversion material facing the excitation light, wherein the second dichroic element has dichroic characteristics that transmit the excitation light and reflect the first converted light.

20. The method of claim 5, further comprising providing an air gap between the first wavelength conversion material or the second wavelength conversion material and the dichroic element.

* * * * *